(12) United States Patent
Choi et al.

(10) Patent No.: US 7,489,558 B2
(45) Date of Patent: Feb. 10, 2009

(54) PROGRAM METHOD OF FLASH MEMORY CAPABLE OF COMPENSATING READ MARGIN REDUCED DUE TO CHARGE LOSS

(75) Inventors: Ki-Hwan Choi, Seongnam-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 27 days.

(21) Appl. No.: 11/700,834

(22) Filed: Feb. 1, 2007

(65) Prior Publication Data

US 2007/0183210 A1 Aug. 9, 2007

(30) Foreign Application Priority Data

Feb. 1, 2006 (KR) .............. 10-2006-0009781

(51) Int. Cl.
G11C 16/04 (2006.01)
G11C 16/06 (2006.01)

(52) U.S. Cl. .............. 365/185.24; 365/185.03; 365/185.22; 365/185.28

(58) Field of Classification Search .......... 365/185.22, 365/185.24
See application file for complete search history.

(56) References Cited

U.S. PATENT DOCUMENTS 6,639,849 B2 10/2003 Takahashi et al.
6,643,177 B1 11/2003 Le et al.
6,738,287 B2 5/2004 Yano
6,778,442 B1 8/2004 Hamilton et al.
7,362,612 B2* 4/2008 Kang et al. ............ 365/185.09
2003/0169621 A1 9/2003 Kawamura
2006/0056238 A1* 3/2006 Park et al. ............. 365/185.22
2007/0159889 A1* 7/2007 Kang et al. ............ 365/185.22
2007/0159892 A1* 7/2007 Kang et al. ............ 365/185.24
2007/0171726 A1* 7/2007 Kang et al. ............ 365/185.22
2007/0279989 A1* 12/2007 Aritome ................ 365/185.18

FOREIGN PATENT DOCUMENTS

| JP | 11-317087 | 11/1999 |
|---|---|---|
| JP | 2002-184191 | 6/2002 |
| JP | 2003-346485 | 12/2003 |
| KR | 1999-0066130 | 8/1999 |

* cited by examiner

Primary Examiner—Son L Mai
(74) Attorney, Agent, or Firm—Volentine & Whitt, PLLC

(57) ABSTRACT

The present invention provides a program method of a flash memory device including a plurality of memory cells for storing multi-bit data indicating one of a plurality of states. The memory cells are subjected to a primary program operation. Those memory cells arranged within a specific region of respective states are subjected to a secondary program operation to have a threshold voltage equivalent to or higher than a verify voltage used in the primary program operation. Thus, although a threshold voltage distribution is widened due to an electric field coupling/F-poly coupling and HTS, a read margin between adjacent states may be sufficiently secured using the program method.

14 Claims, 7 Drawing Sheets

Programmed Memory Cell          Memory Cell To Be Programmed

PROGRAM METHOD OF FLASH MEMORY CAPABLE OF COMPENSATING READ MARGIN REDUCED DUE TO CHARGE LOSS

BACKGROUND OF THE INVENTION

1. Field of the Invention

Embodiments of the invention relate to a flash memory system. More particularly, embodiments of the invention relate to a flash memory system capable of compensating for reduced read margins due to charge loss.

This U.S non-provisional patent application claims priority under 35 U.S.C § 119 of Korean Patent Application 2006-09781 filed on Feb. 1, 2006, the entirety of which is hereby incorporated by reference.

2. Discussion of Related Art

In recent years, storage devices such as volatile memory devices and non-volatile memory devices have been increasingly applied to MP3 players and mobile appliances such as, for example, portable multimedia players (PMPs), cellular phones, notebook computers, and personal digital assistances (PDAs). The MP3 players and the mobile appliances require mass storage devices for offering various functions (e.g., moving picture playback). Many efforts have been made for meeting the requirement. One of these efforts is to propose a multi-bit memory device where at least 2-bit data are stored in one memory cell. Exemplary multi-bit memory devices are disclosed, for example, in U.S. Pat. Nos. 6,122,188; 6,075,734; and 5,923,587 which are incorporated herein by reference.

When 1-bit data is stored in one memory cell, the memory cell has a threshold voltage belonging to one of two threshold voltage distributions, i.e., the memory cell has one of two states indicating data "0" and data "1". On the other hand, when 2-bit data is stored in one memory cell, the memory cell has a threshold voltage belonging to one of four threshold voltage distributions, i.e., the memory cell has one of four states indicating data "11", data "10", data "00", and data "01". Threshold voltage distributions corresponding to four states are illustrated in FIG. 1.

Threshold voltage distributions corresponding to four states should be carefully controlled such that each of the threshold voltage distributions exists within a determined threshold voltage window. In order to achieve this, a programming method using an increment step pulse programming (ISPP) scheme has been suggested. In the ISPP scheme, a threshold voltage shifts by the increment of a program voltage according to the repetition of program loops. By setting the increment of a program voltage to a small value, threshold voltage distributions may be minutely controlled to secure a sufficient margin between states. Unfortunately, this leads to increase of time required for programming a memory cell to reach a desired state. Accordingly, the increment of the program voltage may be determined based on the programming time.

In spite of such an ISPP scheme, a threshold voltage distribution of each state is generated to be wider than a desired window due to various causes. For example, as indicated by dotted lines 10, 11, 12, and 13 of FIG. 1, a threshold voltage distribution is widened due to a coupling between adjacent memory cells in a programming operation. Such a coupling is called an "electric field coupling" or "F-poly coupling". For example, as illustrated in FIG. 2, assuming that a memory cell MCA is a cell programmed to have one of four states and a memory cell MCB is a cell programmed to have one of four states, charges are accumulated in a floating gate (FG) as the memory cell MCB is programmed. When memory cell MCB is programmed, a voltage of floating gate FG of adjacent memory cell MCA rises due to a coupling between floating gates FG of the memory cells MCA and MCB. The rising threshold voltage is maintained due to a coupling between floating gates even after programming memory cell MCB. The memory cell MCB includes memory cells arranged in a wordline direction and/or a bitline direction relative to the memory cell MCA. Due to such a coupling, the threshold voltage of the programmed memory cell MCA rises and the threshold voltage distributions are widened as indicated by the dotted lines 10, 11, 12, and 12 of FIG. 1. Accordingly, a margin between states is reduced, as illustrated in FIG. 1 which is a reduction of the read margin (difference in voltage in determining the presence of a "1" or a "0").

One conventional technique for preventing a threshold voltage distribution from being widened due to a coupling is disclosed in U.S. Pat. No. 5,867,429. Not only an electric field coupling/F-poly coupling but also a read margin between states is reduced as threshold voltages of memory cells drop with the lapse of time, which will be hereinafter referred to as "hot temperature stress (HTS)". HTS means that charges accumulated in a floating gate of a memory cell are drained to a substrate. As the charges of the floating gate are reduced, threshold voltages of memory cells in respective states drop, as indicated by dotted lines 20, 21, and 22 of FIG. 3. Accordingly, a threshold voltage increases due to an electric field coupling/F-poly coupling and a threshold voltage decreases due to HTS which makes it difficult to secure a read margin between states. In particular, it is difficult to know a state of the programmed memory cell. This problem becomes severe with the recent trend toward more complex semiconductor fabrication processes.

Accordingly, there is a need for securing a read margin between states even if a threshold voltage increases due to an electric field coupling/F-poly coupling and a threshold voltage decreases due to HTS.

SUMMARY OF THE INVENTION

An exemplary embodiment of the present invention provides a program method of a flash memory device including a plurality of memory cells for storing multi-bit data indicating one of a plurality of states. The program method may include programming selected memory cells with multi-bit data to correspond to one of a plurality of states. Programmed memory cells arranged within a predetermined threshold voltage region are detected. The predetermined region is selected by one of a first verify voltage, a read voltage and a second verify voltage. The second verify voltage being higher than the first verify voltage. The detected memory cells are programmed to have a threshold voltage equivalent to or higher than a second verify voltage corresponding to the respective states wherein the second verify voltages are set to have different voltage levels.

DESCRIPTION OF EMBODIMENTS

Figure 1:
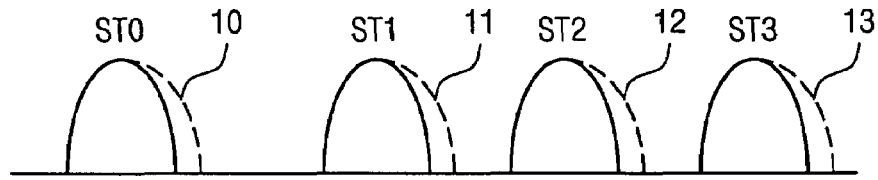
FIG. 1 illustrates that threshold voltage distributions are widened due to an electric field coupling/F-poly coupling.
Figure 2:
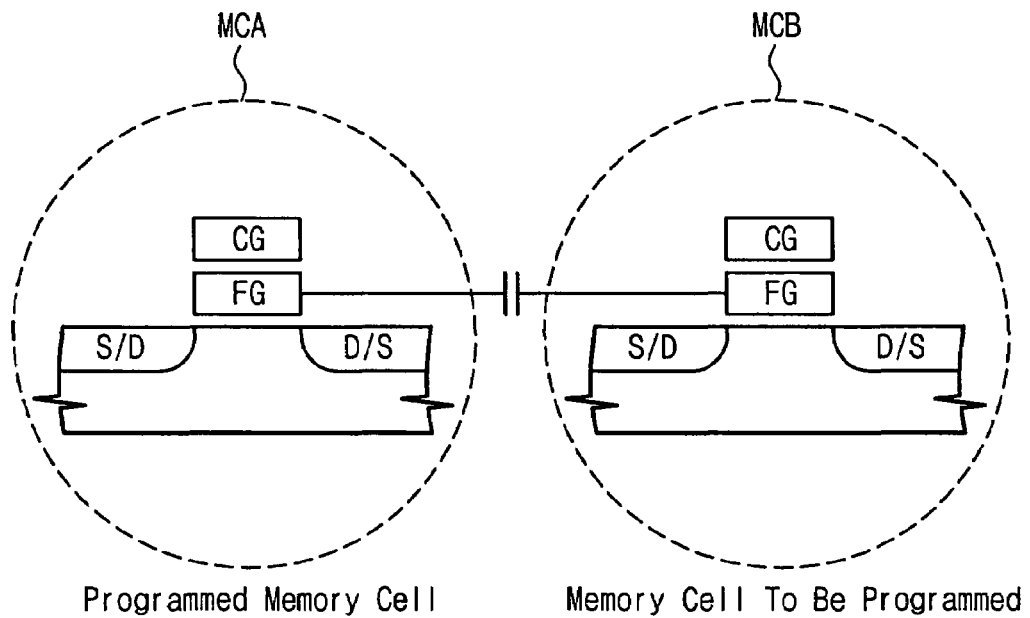
FIG. 2 illustrates an electric field coupling/F-poly coupling generated between memory cells.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 4:
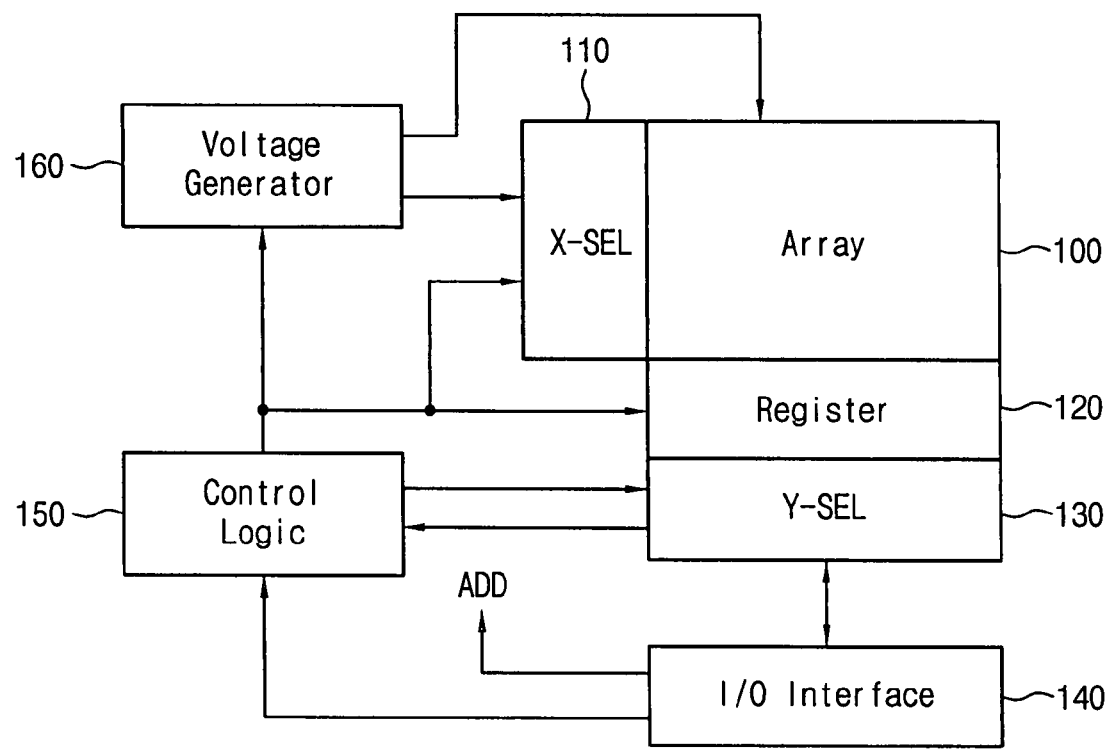
FIG. 4 is a block diagram of a flash memory device according to the present invention.

FIG. 4 is a block diagram of a flash memory device according to an embodiment of the present invention which comprises a memory cell array 100 for storing data information. The memory cell array 100 includes a plurality of memory blocks each having a memory cell configuration illustrated in FIG. 5.

Figure 5:
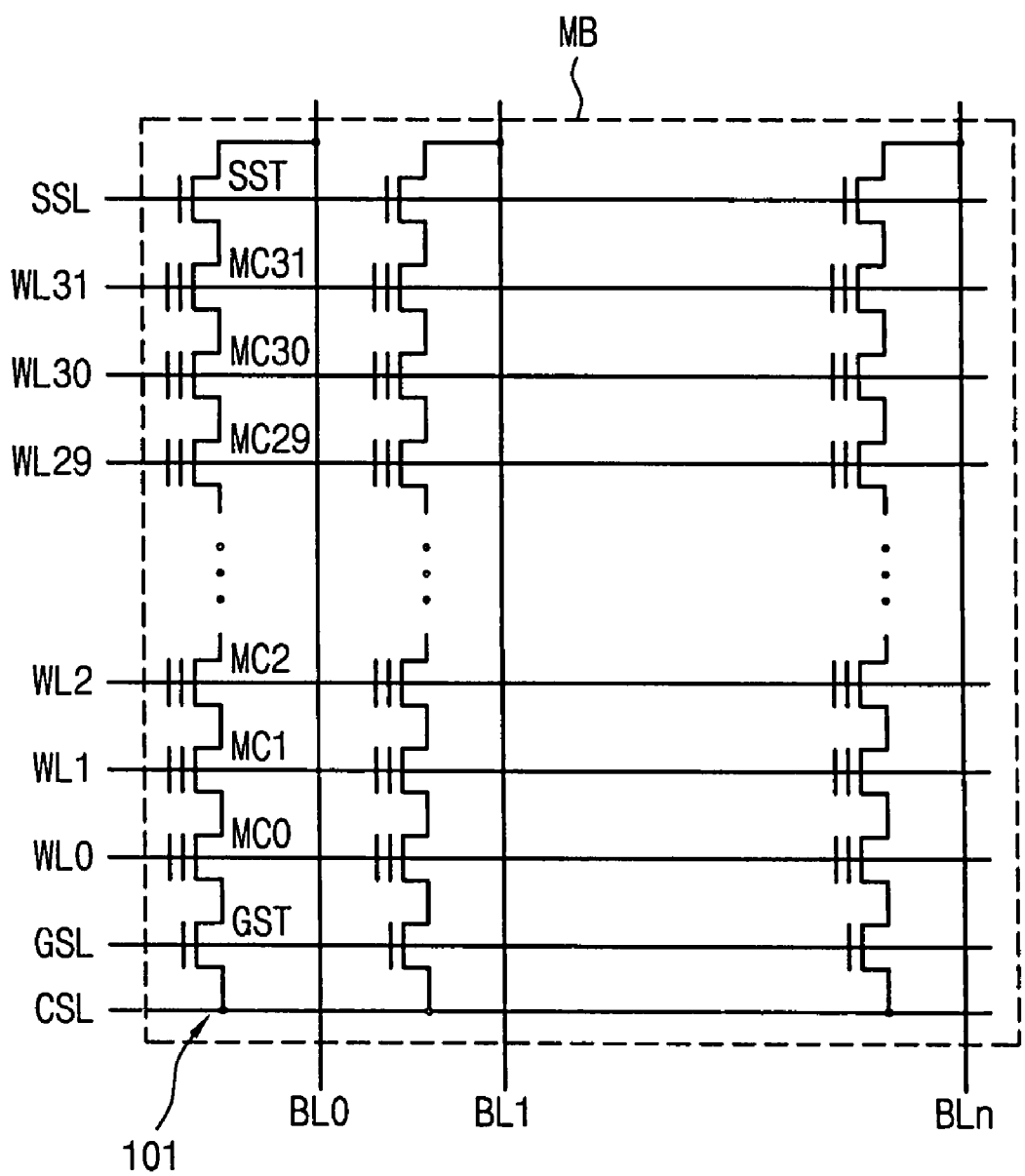
FIG. 5 is a circuit diagram of a memory cell array illustrated in FIG. 4.

FIG. 5 is a circuit diagram of a memory cell array illustrated in FIG. 4 comprising a memory block MB that includes a plurality of strings 101 each having a string select transistor SST, a ground select transistor GST, and memory cells MC31-MC0. The string selection transistor SST is controlled by a string select line SSL and has a drain connected to a corresponding bitline. The memory cells MC31-MC0 are serially coupled between a source of the string select transistor SST and a drain of the ground select transistor GST and controlled by corresponding wordlines WL31-WL0, respectively. It will be understood by those skilled in the art that the number of wordlines is not limited thereto. Each memory cell is comprised of a floating gate transistor.

A plurality of bitline pairs (BLe0, BLo0)-(BLe(n-1), BLo (n-1)) are arranged to cross wordlines WL31-WL0. During read/program operations, one bitline of each bitline pair is selected by register 120, which means that one wordline includes two pages. Hereinafter, bitlines denoted as "e" will be referred to as "even-number bitlines" and bitlines denoted as "o" will be referred to as "odd-number bitlines". On the other hand, it will be understood by those skilled in the art that one wordline may include one page.

Returning to FIG. 4, a row selector circuit (X-SEL) 100 is controlled by a control logic 150. The row selector circuit 100 selects one of memory blocks in response to an address ADD provided through an input/output interface (I/O interface) 140 and controls rows (including wordlines and select lines) of the selected memory block. A register block 120 is controlled by the control logic 150 and functions as a sense amplifier or a write driver according to an operation mode. Although not illustrated in this figure, the register block 120 will be comprised of page buffers. Each of the page buffers is electrically connected to one bitline or one of a pair of bitlines and reads data from a memory cell or stores data in the memory cell through a bitline.

A column selector circuit (Y-SEL) 130 is controlled by the control logic and outputs data stored in the register block 120 to the I/O interface 140 or the control logic 150 in response to the address ADD provided through the I/O interface 140. For example, in a normal read operation, the column selector circuit 130 outputs data stored in the register block 120 to the I/O interface 140. In a verify normal read operation, the column selector circuit 130 outputs data stored in the register block 120 to the control logic 150 and the control logic 150 judges whether the data provided from the column selector circuit 130 is pass data. During a data loading period of a program operation, the column selector circuit 130 outputs program data transferred through the I/O interface 140 to the register block 120. The control logic 150 is configured to control general operations of a flash memory device. A voltage generator 160 is controlled by the control logic 150 and configured to generate voltages (e.g., a wordline voltage, a bulk voltage, a read voltage, a pass voltage, etc.) required for program/erase/read operations.

As described below, a flash memory device according to an aspect of the present invention adopts a novel program technology for sufficiently securing a read margin between states even if memory cells are subjected to an electric field coupling/F-poly coupling and HTS. In accordance with the programming of the present invention, 2-bit data is stored in respective memory cells of a selected page so that memory cells are programmed using target threshold voltages of respective desired states. This is hereinafter referred to as a "primary program operation". After the primary program operation is completed, read operations are executed to detect memory cells arranged within a predetermined threshold voltage region among the memory cells of the respective states. The detected memory cells are programmed to have a higher threshold voltage than target threshold voltages of the respective states. This is hereinafter referred to as a "secondary program operation".

The primary program operation for storing 2-bit data varies with the configuration of the register block 120. For example, after loading both LSB and MSB data bits on the register block 120, the first program operation may be executed. Alternatively, programming MSB data bit (hereinafter referred to as "MSB program operation") may be followed by programming LSB data bit (hereinafter referred to as "LSB program operation"). The latter program method, as an exemplary program method, will now be described in brief with reference to FIG. 6A and FIG. 6B.

Figure 6A:
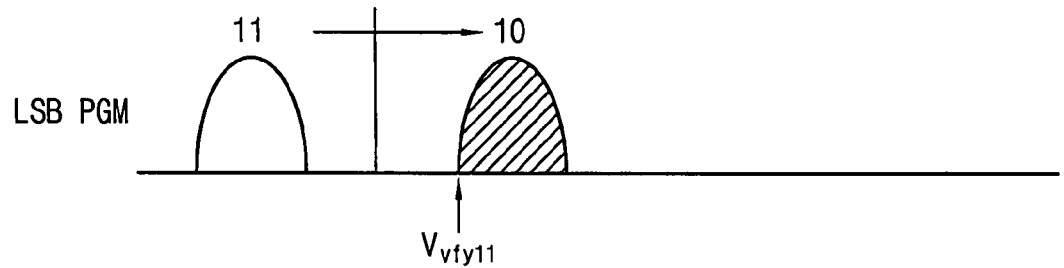
FIG. 6A and FIG. 6B illustrate a multi-bit program operation according to the present invention.
Figure 6B:
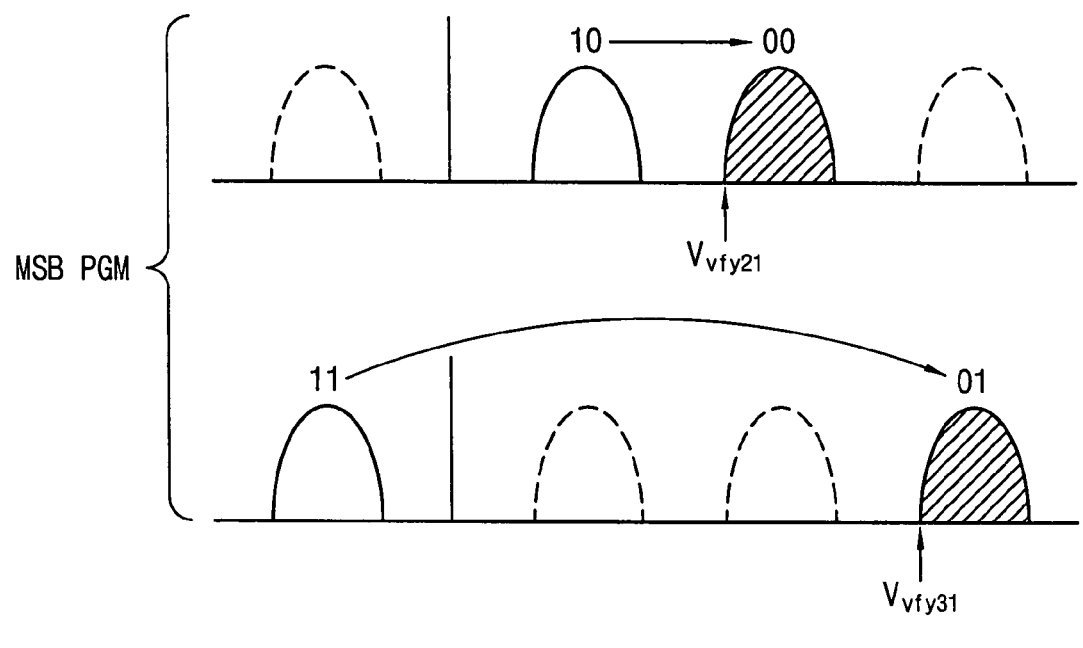
Figure 6B:
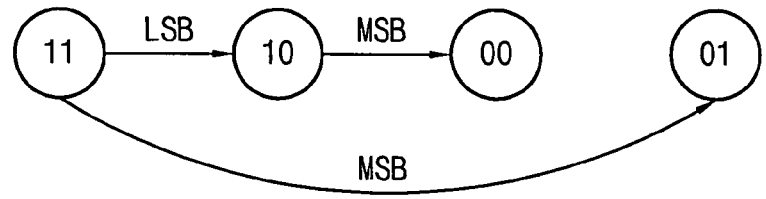

One memory cell is programmed to have one of "11", "10", "00", and "01" states. For the convenience of description, it is assumed that the "11", "10", "00", and "01" states correspond to ST0, ST1, ST2, and ST3, respectively. A memory cell having the "11" state is an erased memory cell, and a threshold voltage of a memory cell having the "10" state is higher than that of the memory cell having the "11" state. A threshold voltage of a memory cell having the "00" state is higher than that of a memory cell having the "10" state. Further, a threshold voltage of a memory cell having the "01" state is higher than that of a memory cell having the "00" state. If an LSB program operation is executed under the foregoing condition, a memory cell has an erased state or a "10" state, as illustrated in FIG. 6A. If an MSB program operation is executed following the LSB program operation, a memory cell having the "11" state has an erased state or a "01" state while a memory cell having the "10" state has a "10" or "00" state, as illustrated in FIG. 6B.

Figure 7A:
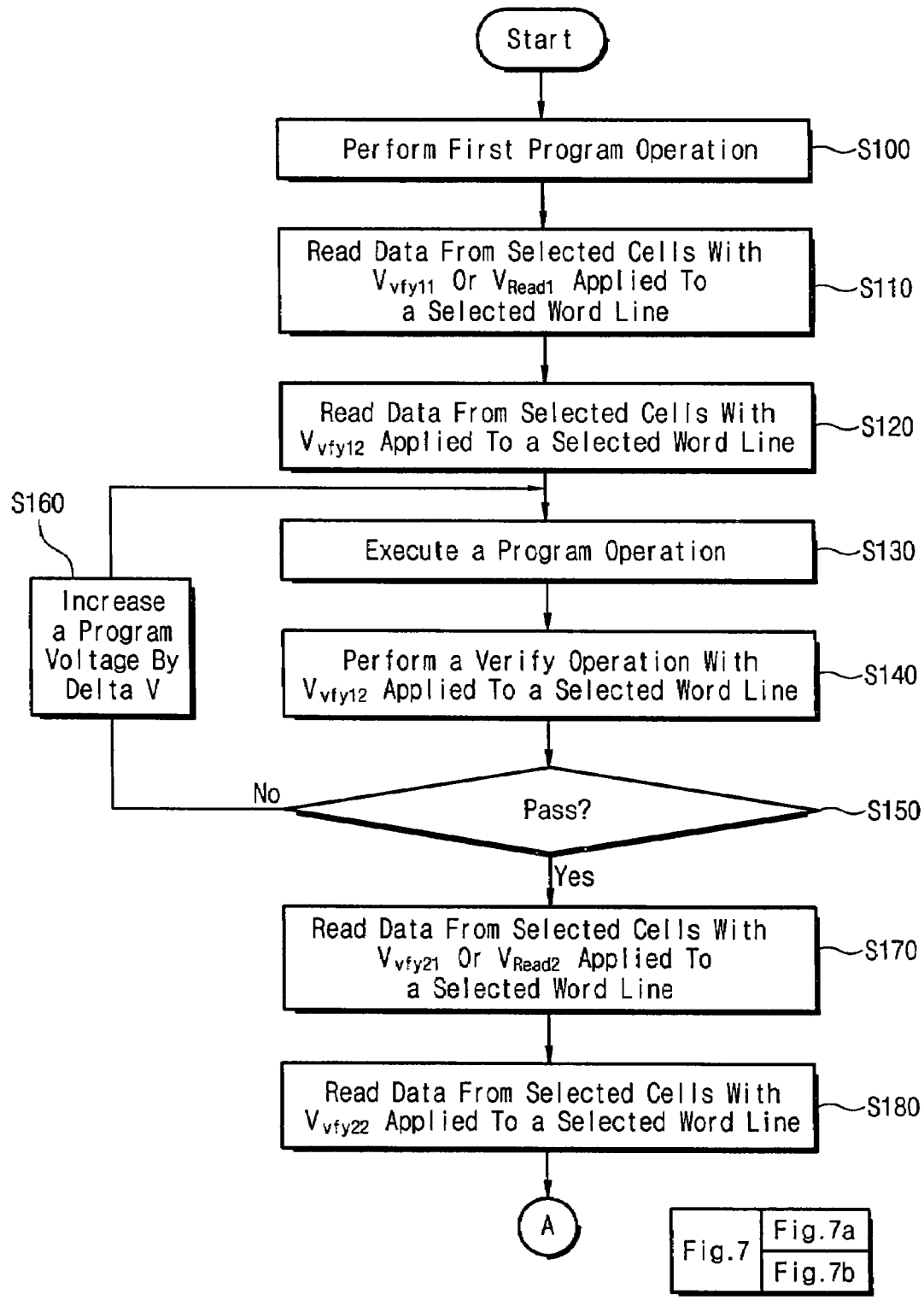
FIGS. 7A and 7B are a flowchart illustrating a program method of a flash memory device according to an embodiment of the present invention.
Figure 7B:
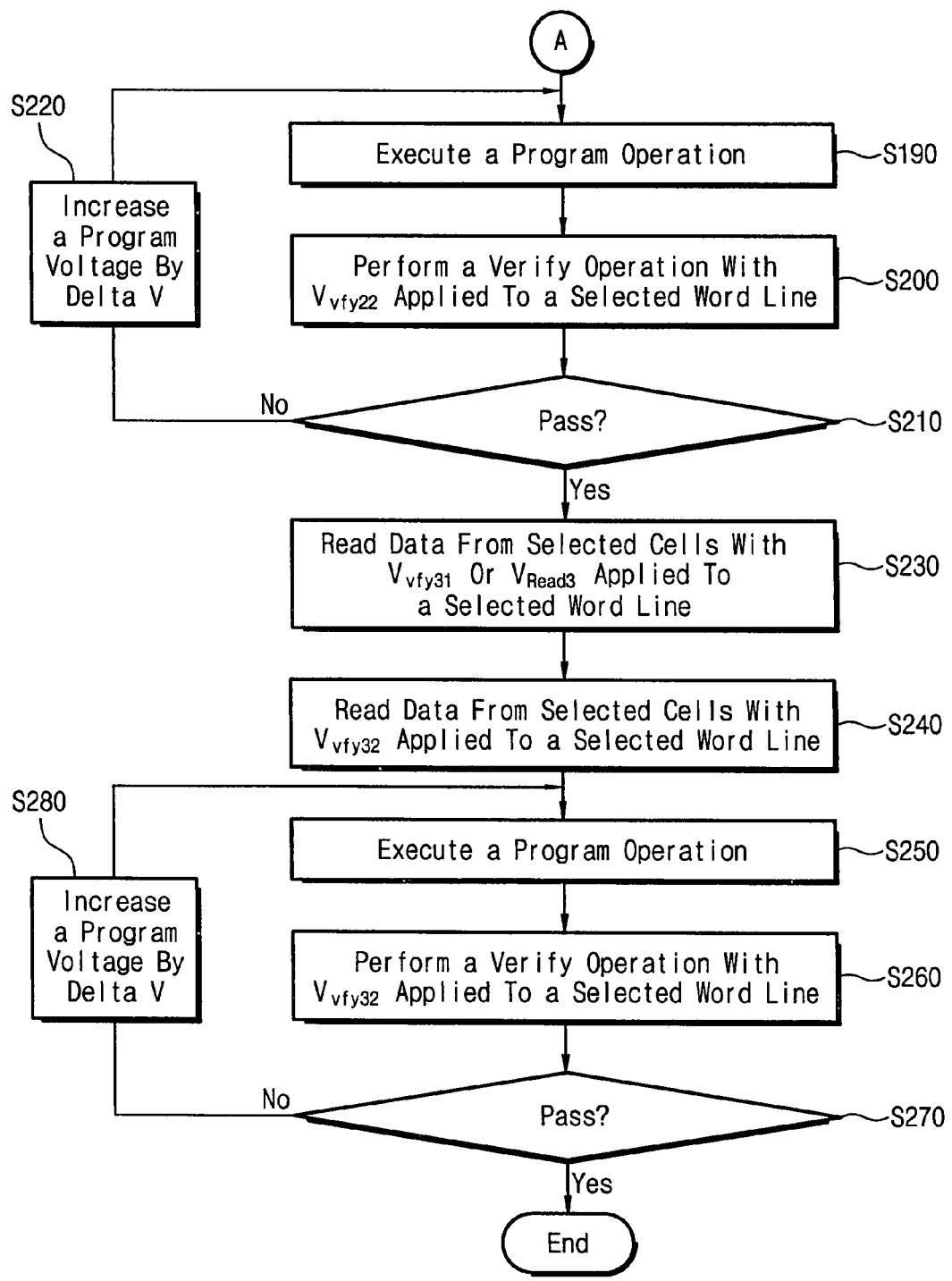
Figure 8:
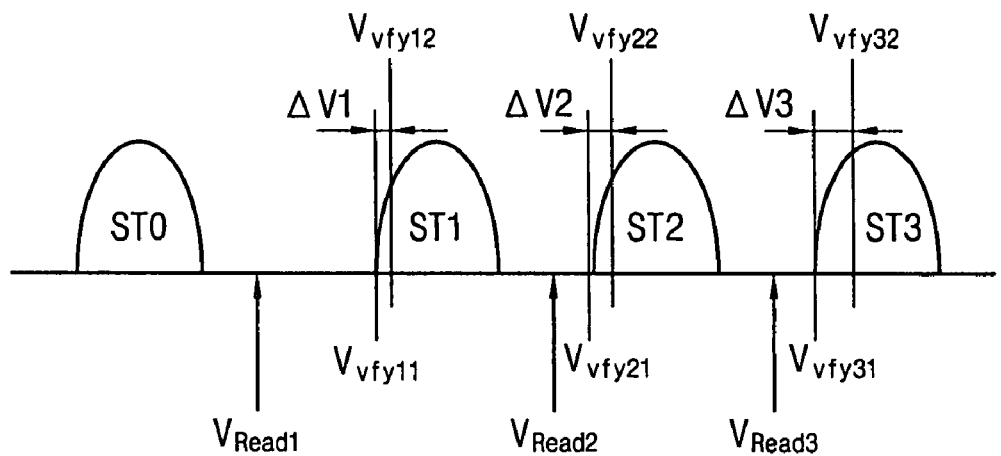
FIG. 8 illustrates verify voltages when executing a program operation of a flash memory device according to the present invention.
Figure 9:
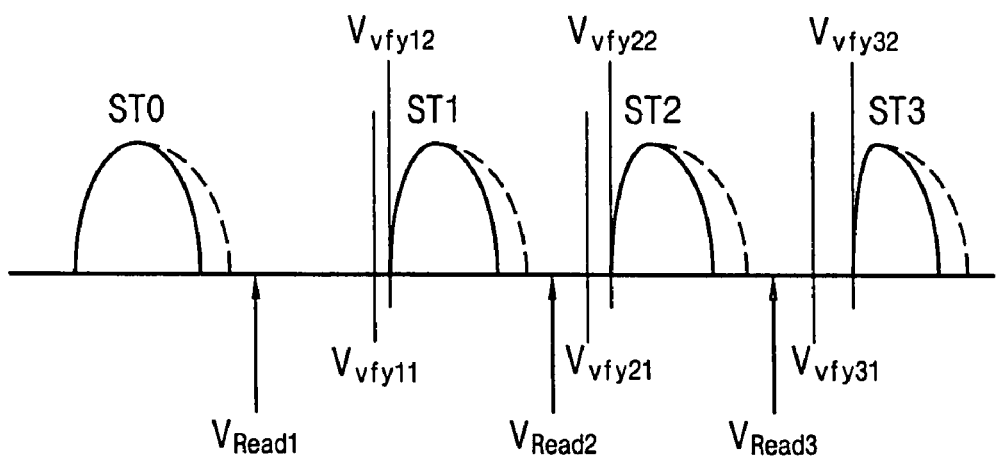
FIG. 9 illustrates threshold voltage distributions after executing a program operation of a flash memory device according to the present invention.

FIG. 7 is a flowchart illustrating a program method of a flash memory device in accordance with an embodiment of the present invention. FIG. 8 illustrates associated verify voltages when executing a program operation of a flash memory device according to the present invention, and FIG. 9 illustrates threshold voltage distributions after executing a program operation of a flash memory device according to the present invention. A program method according to the invention will now be described more fully hereinafter with reference to accompanying drawings.

A first program operation is executed according to the program method described with reference to FIG. 6A and FIG. 6B at step S100. While the first program operation is executed, memory cells of a selected page are programmed to one of the respective states ST1, ST2, and ST3 shown in FIG. 8. Using verify voltages Vvfy11, Vvfy21, and Vvfy31 corresponding to the states ST1, ST2, and ST3, it is determined whether the memory cells are programmed to the respective states (see FIG. 8). For example, using the verify voltage Vvfy11, it is determined whether a memory cell is programmed to the ST1 state; using the verify voltage Vvfy21, it is determined whether a memory cell is programmed to the ST2 state; and using the verify voltage Vvfy31, it is determined whether a memory cell is programmed to the ST3 state.

If the first program operation for 2-bit data is completed, selected memory cells are arranged within a specific region among threshold voltage distributions each corresponding to the respective states ST1, ST2, and ST3. A read operation is executed through register block 120 while a verify voltage Vvfy11 (or a read voltage Vread1) is applied to a selected wordline at step S110. A read operation is executed through register block 120 while a verify voltage Vvfy12 higher than the verify voltage Vvfy11 is applied to the selected wordline at step S120. By executing the read operation twice in steps S110 and S120, memory cells having a threshold voltage between the verify voltages Vvfy21 and Vvfy22 (or a read voltage Vread2 and the verify voltage Vvfy22) (see FIG. 8) are detected. It will be understood by those skilled in the art that method of detecting memory cells having threshold voltages between verify voltages of respective states vary with the configuration of register block 120.

If the memory cells having the threshold voltages between the verify voltages Vvfy11 and Vvfy12 (or the read voltages Vread1 and Vread2) are detected, a program operation is executed for the detected memory cells at step S130. After executing the program operation, a verify read operation is executed while the verify voltage Vvfy12, acting as a read operation, is applied to a selected wordline at step S140. A determination is made at step S150 whether the detected memory cells are programmed to have a threshold voltage corresponding to the verify voltage Vvfy12. When the determination result is that all the detected memory cells are not programmed with a required threshold voltage, a program voltage to be applied to the selected wordline increases by a predetermined increment at step S160 and the routine returns to step S130. The program loop from step S130 to step S160 repeats either a predetermined number of times or until all the detected memory cells are programmed.

When the determination result is that all the detected memory cells are programmed with the required program voltage, a read operation is executed through register block 120 while a verify voltage Vvfy13 (or a read voltage Vread3) is applied to a selected wordline at step S230. Thereafter, a read operation is executed through register block 120 while a verify voltage Vvfy32, higher than the verify voltage Vvfy31, is applied to the selected wordline at step S240. By executing the read operation twice at steps S230 and S240, memory cells having threshold voltages between the verify voltages Vvfy31 and Vvfy32 (or the read voltages Vread3 and the verify voltage Vvfy32) are detected. If the memory cells having threshold voltages between the verify voltages Vvfy31 and Vvfy32 (or the read voltages Vread3 and the verify voltage Vvfy32) are detected, a program operation is executed for the detected memory cells at step S250. After the program operation is executed, step S260 executes a verify read operation while the verify voltage Vvfy32, acting as a read operation, is applied to the selected wordline. A determination is made at step S270 whether the detected memory cells are programmed to have a threshold voltage corresponding to the verify voltage Vvfy32. If the determination result is that all the detected memory cells are not programmed with a required threshold voltage, a program voltage to be applied to the selected wordline increases by a predetermined increment at step S280. This routine returns to step S250, which is repeated until a program loop comprising steps S250-S280 runs a predetermined number times or the detected memory cells are all programmed with the required threshold voltage.

Figure 3:
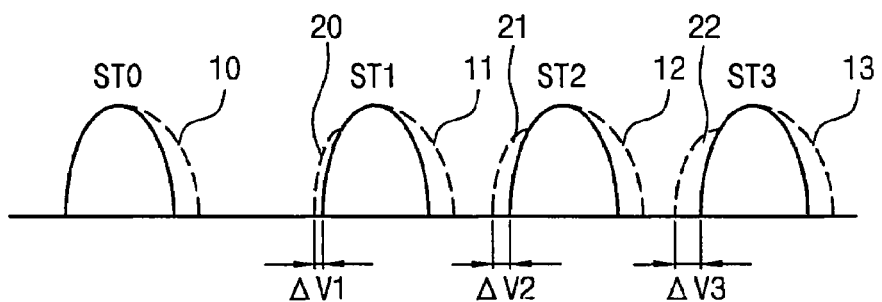
FIG. 3 illustrates that threshold voltage distributions are widened due to high temperature stress (HTS).

FIG. 9 illustrates threshold voltages after a program procedure according to the present invention is ended. In a threshold voltage distribution corresponding to a state ST1, memory cells between verify voltages Vvfy11 and Vvfy12 (or a read voltage Vread1 and the verify voltage Vvfy12) are programmed to have the verify voltage Vvfy12 or a voltage higher than the verify voltage Vvfy12. As shown in FIG. 9 and FIG. 3, a margin between states ST0 and ST1 increases. A voltage difference between the verify voltages Vvfy11 and Vvfy12 is denoted as "$\Delta V1$" (see FIG. 8). In a threshold voltage distribution corresponding to the state ST2, memory cells between verify voltages Vvfy21 and Vvfy22 (or a read voltage Vread2 and the verify voltage Vvfy22) are programmed to have the verify voltage Vvfy22 or a voltage higher than the verify voltage Vvfy22. As shown in FIG. 9 and FIG. 3, a margin between states ST1 and ST2 increases. A voltage difference between the verify voltages Vvfy21 and Vvfy22 is denoted as "$\Delta V2$" (see FIG. 8) where $\Delta V2$ is higher than voltage difference $\Delta V1$. Similarly, in a threshold voltage distribution corresponding to state ST3, memory cells between verify voltages Vvfy31 and Vvfy32 (or a read voltage Vread3 and the verify voltage Vvfy32) are programmed to have the verify voltage Vvfy32 or a voltage higher than the verify voltage Vvfy32. As shown in FIG. 9 and FIG. 3, a margin between states ST2 and ST3 increases. A voltage difference between the verify voltages Vvfy31 and Vvfy32 is denoted as "$\Delta V3$" (see FIG. 8) where $\Delta V3$ is higher than the voltage difference $\Delta V2$.

According to the above-described program method, verify voltages Vvfy12, Vvfy22, and Vvfy32 of a secondary program operation are set differently. As previously stated, verify voltage Vvfy22 is higher than verify voltage Vvfy12, and verify voltage Vvfy32 is higher than verify voltage Vvfy22. This is because charge loss caused by HTS varies with the states, i.e., charge loss caused by HTS becomes greater with increase in number of charges accumulated on a floating gate of each memory cell. Therefore, verify voltages Vvfy12, Vvfy22, and Vvfy32 corresponding to the respective states should be set to increase gradually or voltage differences $\Delta V1$, $\Delta V2$, and $\Delta V3$ should be set to increase gradually.

As discussed above, a read margin between adjacent states increases more than a read margin as illustrated in FIG. 3. Accordingly, after being subjected to a primary program operation, memory cells arranged within a specific region of respective states are subjected to a secondary program operation to have a threshold voltage equivalent to or higher than a verify voltage of the primary program operation. Thus, although a threshold voltage distribution is widened due to an electric field coupling/F-poly coupling and HTS, a read margin between adjacent states may be sufficiently secured using the program method according to the present invention.

It will be understood by those skilled in the art that a secondary program operation is not limited to the embodiment of the invention. As described above, for example, a threshold voltage decrement caused by HTS becomes greater with increase in number of charges accumulated on a floating gate of a memory cell. Accordingly, the secondary program operation may be executed for states ST2 and ST3 or only state ST3. In this case, the secondary program operation is executed in the same manner as described above. Alternatively, the secondary program operation may be executed by detecting all memory cells arranged within a specific region of a threshold voltage distribution of each state and simultaneously programming the detected memory cells belonging to states ST1, ST2, and ST3.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A program method of a flash memory device including a plurality of memory cells for storing multi-bit data indicating one of a plurality of states, the program method comprising:
   programming selected memory cells with multi-bit data to have one of the plurality of states;
   detecting programmed memory cells arranged within a predetermined threshold voltage region among the memory cells of the respective states, wherein the predetermined threshold region of the respective states is selected by both one of a first verify voltage and a read voltage and a second verify voltage, the second verify voltage being higher than the first verify voltage; and
   programming the detected memory cells to have a threshold voltage equivalent to or higher than the second verify voltage corresponding to the respective states, wherein the second verify voltages are set to have different voltage levels.

2. The program method as recited in claim 1, wherein the plurality of states comprise:
   a first state corresponding to an erased memory cell; and
   a second, third and fourth states corresponding to a programmed memory cell.

3. The program method as recited in claim 2, wherein the detected memory cells have one of the second, third or fourth states.

4. The program method as recited in claim 2, wherein a voltage difference between said first and second verify voltages corresponding to the third state is greater than a voltage difference between said first and second verify voltages corresponding to the second state, and a voltage difference between said first and second verify voltages corresponding to the fourth state is greater than the voltage difference between said first and second verify voltages corresponding to the third state.

5. The program method as recited in claim 1, wherein the first verify voltage corresponding to a respective state is used to determine whether the selected memory cells are programmed with multi-bit data.

6. A program method of a flash memory device including a plurality of memory cells for storing multi-bit data indicating at least one of first, second, third or fourth states, the program method comprising:
   programming selected memory cells with multi-bit data to have one of the first, second, third or fourth states;
   detecting programmed cells arranged within a predetermined threshold voltage region where programmed memory cells of the second state are distributed wherein the predetermined region of the second state is selected by both one of a first verify voltage and a read voltage and a second verify voltage associated with said second state, said second verify voltage associated with said second state being higher than said first verify voltage associated with said second state;
   programming the detected memory cells to have a voltage equivalent to or higher than a second verify voltage corresponding to the second state;
   detecting programmed memory cells arranged within a predetermined threshold voltage region where programmed memory cells of the third state are distributed, wherein the predetermined region of the third state is selected by both one of a first verify voltage and a read voltage and a second verify voltage associated with said third state, said second verify voltage associated with said third state being higher than said first verify voltage associated with said third state;
   programming the detected memory cells to have a threshold voltage equivalent to or higher than a second verify voltage corresponding to said third state;
   detecting programmed memory cells arranged within a predetermined threshold voltage region where programmed memory cells of said fourth state are distributed, wherein the predetermined region of the fourth state is selected by both one of a first verify voltage and a read voltage and a second verify voltage associated with said fourth state, said second verify voltage associated with said fourth state being higher than said first verify voltage associated with said fourth state; and
   programming the detected memory cells to have a threshold voltage equivalent to or higher than a second verify voltage corresponding to the fourth state, wherein voltage differences between first and second voltages associated with said second, and third states are different from each other.

7. The program method as recited in claim 6, wherein the second verify voltage associated with said third state is higher than the second verify voltage associated with said second state, and the second verify voltage associated with said fourth state is higher than the second verify voltage associated with said third state.

8. The program method as recited in claim 6, wherein the first verify voltages corresponding to the second, third and fourth states are used to determine whether the selected memory cells are programmed with multi-bit data.

9. The program method as recited in claim 6, wherein the first state indicates an erased memory cell, and each of said second, third and fourth states indicates a programmed memory cell.

10. A program method of a flash memory device including a plurality of memory cells for storing multi-bit data indicating at least one of a plurality of states, the program method comprising:
    programming selected memory cells with multi-bit data to have one of the plurality of states;
    detecting programmed memory cells arranged within a predetermined threshold voltage region where programmed memory cells of at least two of the plurality of states are distributed wherein each predetermined region of the respective two or more states is selected by both one of a first verify voltage and a read voltage and a second verify voltage, the second verify voltage being higher than the first verify voltage; and
    programming the programmed memory cells to have a threshold voltage equivalent to or higher than a second verify voltage corresponding to the at least two of the plurality of states, wherein second verify voltages corresponding to the at least two states of the plurality of states are set to have different voltage levels.

11. The program method as recited in claim 10, wherein the plurality of states comprise:
   a first state indicating an erased memory cell;
   a second state indicating a programmed memory cell;
   a third state indicating a programmed memory cell; and
   a fourth state indicating a programmed memory cell, said at least two of said plurality of states being said second and fourth states.

12. The program method as recited in claim 11, wherein the second verify voltage associated with the fourth state is higher than the second verify voltage associated with the third state.

13. The program method as recited in claim 10, wherein the plurality of states comprise:
   a first state indicating an erased memory cell;
   a second state indicating a programmed memory cell;
   a third state indicating a programmed memory cell; and
   a fourth state indicating a programmed memory cell, said at least two of said plurality of states being said second and third states.

14. The program method as recited in claim 13, wherein the second verify voltage associated with said third state is higher than the second verify voltage associated with the second state.

* * * * *